US012495655B2

(12) United States Patent
Wu et al.

(10) Patent No.: US 12,495,655 B2
(45) Date of Patent: Dec. 9, 2025

(54) OPTOELECTRONIC PACKAGE STRUCTURE AND METHOD OF MANUFACTURING THE SAME

(71) Applicant: Advanced Semiconductor Engineering, Inc., Kaohsiung (TW)

(72) Inventors: Cheng-Hsuan Wu, Kaohsiung (TW); Chang-Yu Lin, Kaohsiung (TW); Yu-Sheng Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 18/617,589

(22) Filed: Mar. 26, 2024

(65) Prior Publication Data

US 2025/0306308 A1 Oct. 2, 2025

Related U.S. Application Data

(63) Continuation of application No. 17/367,052, filed on Jul. 2, 2021, now Pat. No. 11,942,585.

(51) Int. Cl.

| | |
|---|---|
| ***G02B 6/42*** | (2006.01) |
| ***G02B 6/12*** | (2006.01) |
| ***H01L 23/00*** | (2006.01) |
| ***H01L 23/488*** | (2006.01) |
| ***H01L 25/16*** | (2023.01) |

(52) U.S. Cl.

CPC ............. *G02B 6/4245* (2013.01); *G02B 6/12* (2013.01); *G02B 6/4239* (2013.01); *G02B 6/4274* (2013.01); *H01L 23/488* (2013.01); *H01L 24/08* (2013.01); *H01L 25/167* (2013.01); *H01L 2224/08145* (2013.01); *H01L 2224/08225* (2013.01); *H01L 2924/1903* (2013.01)

(58) Field of Classification Search

None

See application file for complete search history.

(56) References Cited

U.S. PATENT DOCUMENTS 4,698,730 A * 10/1987 Sakai .................... F21V 7/0091 313/499
2002/0179914 A1* 12/2002 Sheu ....................... H01L 24/05 257/90

(Continued)

FOREIGN PATENT DOCUMENTS

WO PCTSG20180050445 * 3/2019

OTHER PUBLICATIONS

Non-Final Office Action for U.S. Appl. No. 17/367,052, issued Aug. 4, 2023, 14 pages.

(Continued)

*Primary Examiner* — Feifei Yeung Lopez

(74) *Attorney, Agent, or Firm* — FOLEY & LARDNER LLP

(57) ABSTRACT

An optoelectronic package structure and a method of manufacturing an optoelectronic package structure are provided. The optoelectronic package structure includes a photonic component. The photonic component has an electrical connection region, a blocking region and a region for accommodating a device. The blocking region is located between the electrical connection region and the region for accommodating a device.

10 Claims, 10 Drawing Sheets

(56) References Cited

U.S. PATENT DOCUMENTS

| | | | | |
|---|---|---|---|---|
| 2012/0049756 | A1* | 3/2012 | Schubert | H01L 33/382 438/22 |
| 2012/0207426 | A1* | 8/2012 | Doany | G02B 6/426 257/E33.056 |
| 2013/0182998 | A1 | 7/2013 | Andry et al. | |
| 2014/0269805 | A1 | 9/2014 | Lai et al. | |
| 2015/0241631 | A1 | 8/2015 | Fish et al. | |
| 2020/0096715 | A1 | 3/2020 | Dong et al. | |

OTHER PUBLICATIONS

Notice of Allowance for U.S. Appl. No. 17/367,052, issued Nov. 21, 2023, 7 pages.

* cited by examiner

OPTOELECTRONIC PACKAGE STRUCTURE AND METHOD OF MANUFACTURING THE SAME

CROSS-REFERENCE TO RELATED APPLICATION

This application is a continuation of U.S. patent application Ser. No. 17/367,052, filed Jul. 2, 2021, the content of which is incorporated herein by reference in its entirety.

BACKGROUND

1. Field of the Disclosure

The present disclosure relates generally to an optoelectronic package structure and a method of manufacturing the optoelectronic package structure.

2. Description of the Related Art

Chip-on-chip (CoC) package includes two electronic components stacked on each other. The stacked electronic components are in electrical communication with each other through wire bonding. The bond wires, however, have high resistance and long transmission path. Therefore, CoC package suffers from signal integrity, particularly in high frequency application. In addition, the limitation of conventional wire bonding signal transmission is that the high impedance caused by the extended transmission path prevents high speed data rate, for example, 100 Gbit/s, 400 Gbit/s, or 1.6 Tbit/s, from realization.

In recent years, optical communication is used to replace traditional cable transmission. Optoelectronic devices, such as optical engine, usually require the integration of at least an electronic IC (EIC) and a photonic IC (PIC). The trend tends to stack an EIC, a PIC and a substrate in a vertical direction to reduce power loss. However, after stacking with the EIC, the PIC needs to be integrated with additional optical device(s). Therefore, it is desirable to protect the PIC from being contaminated or damaged before the integration with additional optical device(s) to improve the efficiency of the optoelectronic devices.

SUMMARY

In some embodiments, an optoelectronic package structure includes a photonic component. The photonic component has an electrical connection region, a blocking region and a region for accommodating a device. The blocking region is located between the electrical connection region and the region for accommodating a device.

In some embodiments, an optoelectronic package structure includes a photonic component and an electronic component. The photonic component includes a plurality of bonding pads and at least one blocking pad. The blocking pad is disposed on a side of the photonic component. The photonic component is electrically connected to the electronic component via the plurality of bonding pads. The at least one blocking pad is disposed outside the plurality of bonding pads.

In some embodiments, an optoelectronic package structure includes a photonic component. The photonic component has a first region, a second region and a third region. The second region is located between the first region and the third region. The first region is configured to electrically connect the photonic component to the electronic component. The second region is configured to block a filling material disposed between the photonic component and the electronic component. The third region is configured to accommodate an optical device.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
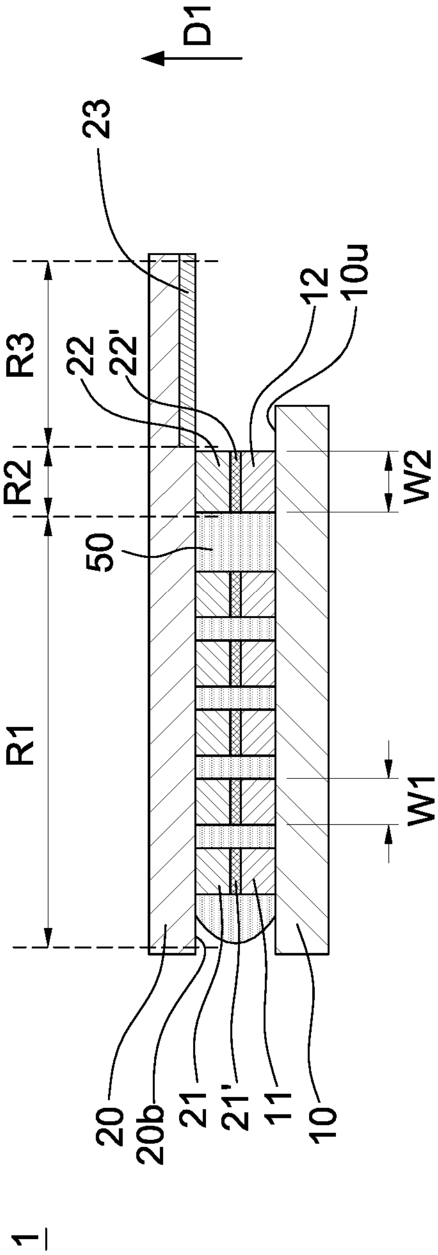
FIG. 1A illustrates a cross-sectional view of a semiconductor package structure in accordance with some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1B:
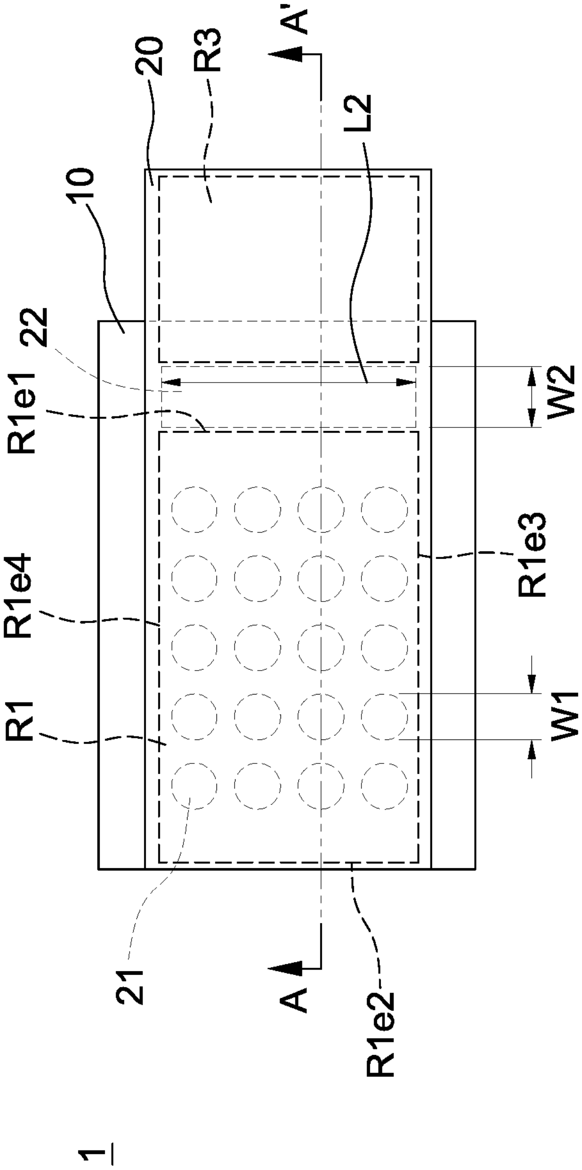
FIG. 1B illustrates a top view of a semiconductor package structure of FIG. 1A.

FIG. 1A illustrates a cross-sectional view of a semiconductor package structure 1 in accordance with some embodiments of the present disclosure taken along the line A-A' of FIG. 1B. FIG. 1B illustrates a top view of the semiconductor package structure 1.

Referring to FIGS. 1A and 1*i*, the semiconductor package structure 1 includes a first component 10 and a second component 20. The second component 20 is disposed over the first component 10. In some embodiments, the semiconductor package structure 1 is an optoelectronic package structure, the first component 10 is an electronic component (e.g., electronic wafer or die), and the second component 20 is a photonic component (e.g., photonic wafer or die).

In some embodiments, the second component 20 has a first region R1, a second region R2 and a third region R3. The second region R2 is located between the first region R1 and the third region R3. The first region R1 may be an electrical connection region R1 and is configured to electrically connect the first component 10 and the second component 20. The second region may be a blocking region R2 and is configured to block a filling material 50 disposed between the first component 10 and the second component 20. The third region R3 may be a region for accommodating a device (e.g., an optical device, but being not limited thereto) and is configured to accommodate the device. In some embodiments, the first region R1, the second region R2 and the third region R3 are located at a same side of the second component 20, and face the first component 10. In some embodiments, the second region R2 and the third region R3 are located at, a lower surface 20*b* of the second component 20. The lower surface 20*b* is an active surface of the second component 20 and faces an upper surface 10*u* (i.e., an active surface) of the first component 10. In the present disclosure, a surface of the first component 10 or a surface of the second component 20 may have different elevations. For example, in some embodiments, the lower surface 20*b* of the second component 20 may include one or more recesses and thus it has different elevations.

The first region R1 may include a plurality of bonding pads 21. The second component 20 is electrically connected to the first component 10 via the bonding pads 21. The bonding pads 21 may be circular, rectangular, square, or in any other suitable shape. The bonding pads 21 may include metal or alloy, such as copper (Cu), aluminum (Al), iron (Fe), zinc (Zn), nickel (Ni), tin (Sn), lead (Pb), silver (Ag), mercury (Hg), gold (Au), a combination thereof, or an alloy thereof. In some embodiments, the bonding pads 21 may be made of metal, such as, Cu and Ni, and a solder material, such as SnAg.

The second region R2 may include at least one blocking pad 22. The blocking pad 22 is disposed along an edge R1*e*1 of the first region R1. The blocking pad 22 may have a shape of strip or any other suitable shape. The second region R2 is located between the first region R1 and the third region R3. The second region R2 separates the third region R3 from the first region R1. Specifically, the third region R3 is separated from the first region R1 by the blocking pad 22. The blocking pad 22 may function as a barrier wall and prevent the filling material 50, which is disposed between the first component 10 and second component 20 to fill between the bonding pads 21, from overflowing to the third region R3. In some embodiments, the blocking pad 22 may electrically connect the first component 10 and the second component 20. In some other embodiments, the blocking pad 22 may not electrically connect the first component 10 and the second component 20.

The blocking pad 22 has a size greater than a size of the bonding pads 21. The blocking pad 22 has a width W2 and a length L2. The length L2 of the blocking pad 22 is greater than a length (not denoted in FIG. 1B) of the bonding pads 21. In the embodiments illustrated in FIG. 1, since the bonding pads 21 have a circular shape, the length of the bonding pads 21 may be substantially the same as the width W1 of the bonding pads. In some embodiments, the width W2 of the blocking pad 22 is substantially the same or greater than the width W1 of one of the bonding pads 21. In some embodiments, the width W2 of the blocking pad 22 is substantially the same or greater than the width W1 of the plurality of the bonding pads 21. It has been found that when the width W2 of the blocking pad 22 is substantially the same or greater than the width W1 of one of the bonding pads 21 (and preferably, the plurality of the bonding pads 21), the blocking pad 22 can more effectively block the filling material or prevent the filling material from entering the third region R3. In the present disclosure, the term "thickness" of an object refers to the largest dimension of the object in a vertical direction (e.g., D1 in FIG. 1A), the term "length" refers to the largest dimension of an object in a horizontal direction, and the term "width" refers to the largest dimension of an object perpendicular to the length of the object in a horizontal direction.

The blocking pad 22 may include metal or alloy, such as copper (Cu), aluminum (Al), iron (Fe), zinc (Zn), nickel (Ni), tin (Sn), lead (Pb), silver (Ag), mercury (Hg), gold (Au), a combination thereof, or an alloy thereof. In some embodiments, the blocking pad 22 may be made of metal, such as, Cu and Ni, and a solder material, such as SnAg. In some embodiments, the blocking pad 22 may have a same material as the bonding pads 21.

In some embodiments, the third region R3 is outside or at least partially outside a projection of the first component 10 on the second component 20.

The third region R3 may include an optical device 23. In some embodiments, the optical device 23 may be disposed in the third region R3 and exposed from the lower surface 20*b* of the second component 20 and/or a lateral surface of the second component 20. In some embodiments, the optical device 23 may have a portion located in the second region R2. The third region R3 is configured to accommodate a device 60 (not shown in FIG. 1A). The device 60 may be an optical device, such as a laser diode, an optical fiber or an optical fiber array unit which may include one or more optical fibers. The optical device 23 may connect to the optical device 60 and couple light with the optical device 60. The optical device 23 may include a waveguide, a fiber coupling structure, or a combination thereof. In some embodiments, the optical device 23 is waveguide for coupling light with the optical device 60. The waveguide may include a core made of silicon or silicon nitride for signal (e.g., light wave) propagation and a cladding layer made of oxide (e.g., silicon oxide) or polymer. In some embodiments, the lower surface 20*b* of the second component 20 in the third region R3 may expose the cladding layer, and the lateral surface of the second component 20 in the third region R3 may expose the core surrounded by the cladding layer, and the exposed core of the waveguide may be further coupled with the optical device 60 for signal (e.g., light wave) propagation. In the embodiments where the blocking pad 22 does not electrically connect the first component 10 and the second component 20, the waveguide may extend into the second region R2. In some embodiments, the optical device 60 does not contact the bonding pads 21 of the first region R1 or the blocking pad 22 of the second region R2. In some embodiments, the blocking pad 22 is located between the optical device 60 and the plurality of bonding pads 21.

Figure 1C:
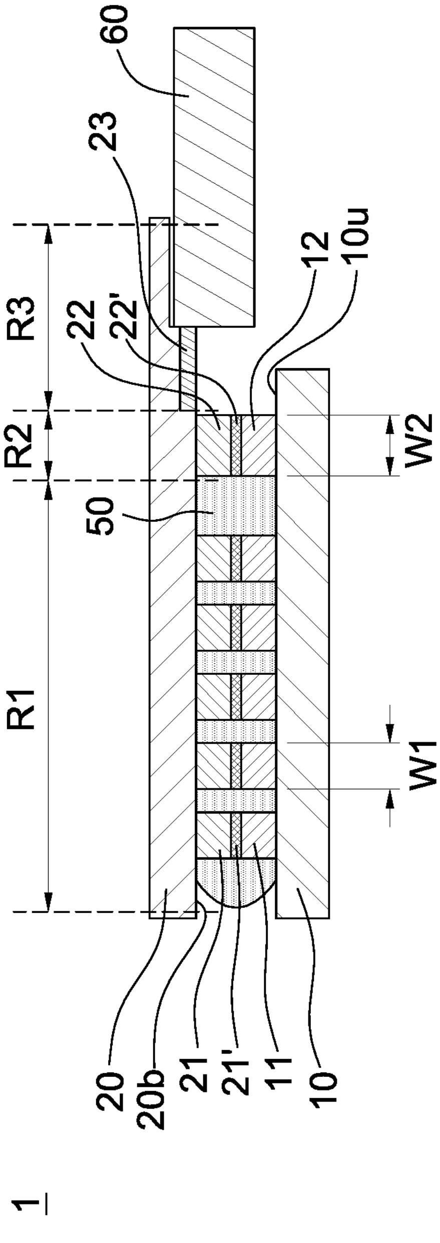
FIG. 1C illustrates a cross-sectional view of a semiconductor package structure in accordance with some embodiments of the present disclosure.

In the embodiments as illustrated in FIG. 1C, the lower surface 20*b* of the second component includes a recess in the third region R3, the optical device 23 is disposed in the second component 20 and exposed from a lateral surface of the second component 20 (i.e., a sidewall of the recess), the optical device 60 is disposed in the recess and coupled with the optical device 23 via the sidewall of the recess.

The first component 10 may have a first region and a second region which correspond to the first region R1 and the second region R2 of the second component 20, respectively. Similarly, the first region of the first component 10 includes a plurality of bonding pads 11, the second region of the first component 10 includes at least one blocking pad 12. The bonding pads 11 may have a shape corresponding the bonding pads 21. The blocking pad 12 may have a shape corresponding the blocking pad 22.

The bonding pads 11 may include metal or alloy, such as copper (Cu), aluminum (Al), iron (Fe), zinc (Zn), nickel (Ni), tin (Sn), lead (Pb), silver (Ag), mercury (Hg), gold (Au), a combination thereof, or an alloy thereof. In some embodiments, the bonding pads 11 may be made of metal, such as, Cu, Ni and Au.

The blocking pad 12 may include metal or alloy, such as copper (Cu), aluminum (Al), iron (Fe), zinc (Zn), nickel (Ni), tin (Sn), lead (Pb), silver (Ag), mercury (Hg), gold (Au), a combination thereof, or an alloy thereof. In some embodiments, the blocking pad 12 may be made of metal, such as, Cu, Ni and Au. In some embodiments, the blocking pad 12 may have a same material as the bonding pads 11.

The blocking pad 12 has a size greater than a size of the bonding pads 11. In some embodiments, the length of the blocking pad 12 is greater than a length of the bonding pads 11. In some embodiments, the width of the blocking pad 12 is substantially the same or greater than the width of one of the bonding pads 11. In some embodiments, the width of the blocking pad 12 is substantially the same or greater than the width of the plurality of the bonding pads 11. It has been found that when the width of the blocking pad 12 is substantially the same or greater than the width of one of the bonding pads 11 (and preferably, the plurality of the bonding pads 11), the blocking pad 12 can more effectively block the filling material or prevent the filling material from entering the third region R3.

The bonding pads 11 of the first component 10 and the bonding pads 21 of the second component 20 form joint structures to provide electrical communication between the first component 10 and the second component 20. The blocking pad 12 of the first component 10 and the blocking pad 22 of the second component 20 form a joint structure and may function as a barrier wall to prevent a filling material 50 from entering the third region R3 of the second component 20. The blocking pad 12 of the first component 10 is disposed outside the plurality of bonding pads 11 of the first component 10. The blocking pad 22 of the second component 20 is disposed outside the plurality of bonding pads 21 of the second component 20.

In some embodiments, the bonding pads 21 may include a solder material 21' at a bottom surface of the bonding pads 21. The solder material 21' may form solder joints after the bonding of the bonding pads 21 and the bonding pads 11. In some other embodiments, the bottom surface of the bonding pads 21 may not include the solder material 21', and in such cases, a direct bonding of the bonding pads 21 and the bonding pads 11 is achieved. Similarly, in some embodiments, the blocking pads 22 may include a solder material 22' at a bottom surface of the blocking pads 22. The solder material 22' may form solder joints after the bonding of the blocking pads 22 and the blocking pads 12. In some other embodiments, the bottom surface of the blocking pads 22 may not include the solder material 22', and in such cases, a direct bonding of the blocking pads 22 and the blocking pads 12 is achieved.

In some embodiments where the blocking pad 22 has a same material as the bonding pads 21 and/or the blocking pad 12 has a same material as the bonding pads 11, the blocking pads, the blocking pad and the joint structure may be fabricated at the same time, which further simplifies the manufacture process.

The semiconductor package structure 1 may further comprises a filling material 50 disposed between the first component 10 and the second component 20. The filling material 50 may fill between the bonding pads 11 of the first component 10 and between the bonding pads 21 of the second component 20. In some embodiments, the filling material 50 may surround the bonding pads 11 of the first component 10 and the bonding pads 21 of the second component 20. In some embodiments, the filling material 50 may be, for example, an underfill, but is not limited thereto. The underfill may include an epoxy resin, polyimide, a phenolic compound or material, a material including a silicone dispersed therein, or a combination thereof.

The filling material 50 is disposed in the first region R1 of the second component 20 (also in the first region of the first component 10). In some embodiments, the filling material 50 may reach a location between the blocking pad 22 and an most adjacent one of the bonding pads 21 (also between the blocking pad 12 and an most adjacent one of the bonding pads 11).

In the existing techniques, a filling material is filled into a space between the first component 10 and the second component 20 to cover the bonding pads 11 of the first component 10 and the bonding pads 21 of the second component 20 after the step of bonding the first component 10 and the second component 20 and before the step of disposing the optical device 60 on the second component 20 and coupling it with the optical device 23. Since whether a sufficient amount of filling material has been filled is generally determined by visual inspection (e.g., naked eyes), it is difficult to precisely control the amount of filling material. Consequently, an overflow of the filling material in the third region R3 may occur. The filling material in the third region R3, if present, will deteriorate the light coupling efficiency between the optical device 60 and the optical device 23 and may contaminate or damage these optical devices. For example, in the embodiments as illustrated in FIG. 1C, an overflow of the filling material in the third region may enter the recess and thus change the depth of the recess for accommodating the optical device 60; as a result, the optical device 60 may not be precisely aligned with the optical device 23 exposed from the sidewall of the recess and the light coupling efficiency is affected.

In the present disclosure, the blocking pads 22 in the second region R2 may function as a barrier wall and thus can block the filling material or prevent the filling material 50 or block the filling material 50 from overflowing to the third region R3. As a result, even when an overflow of the filling material 50 can be observed from one of the edges R1*e*2, R1*e*3 and R1*e*4 of the first region, the filling material 50 is kept out of the third region R3 and is not disposed or present at a location between the optical device 60 and the blocking pad 22. Therefore, visual inspection (e.g., naked eyes) can be adopted to determine whether a sufficient amount of filling material has been filled, without causing an overflow of the filling material 50 to the third region R3.

FIG. 2A, FIG. 2C, FIG. 3, FIG. 4 and FIG. 5 illustrate top views of the semiconductor package structures in accordance with some embodiments of the present disclosure. As illustrated in these drawings, the blocking pad 22 may have different configuration or shape. The blocking pad 12, although not shown in these drawings, may have the same or similar configuration or shape as the blocking pad 22. For simplification purpose, the bond pads 21 and 11 are not shown in these drawings.

Figure 2A:
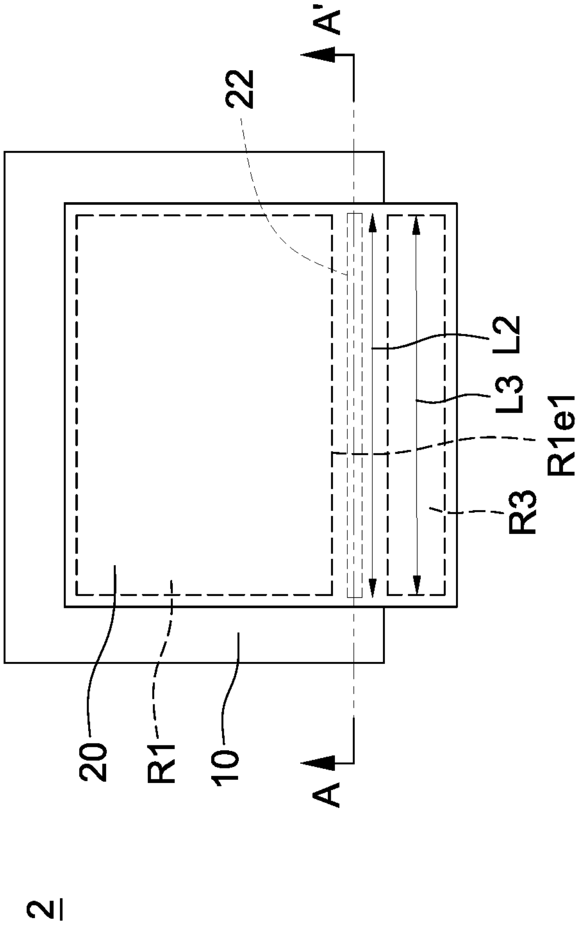
FIG. 2A FIG. 2C, FIG. 3, FIG. 4 and FIG. 5 illustrates top views of semiconductor package structures in accordance with some embodiments of the present disclosure.
Figure 2B:
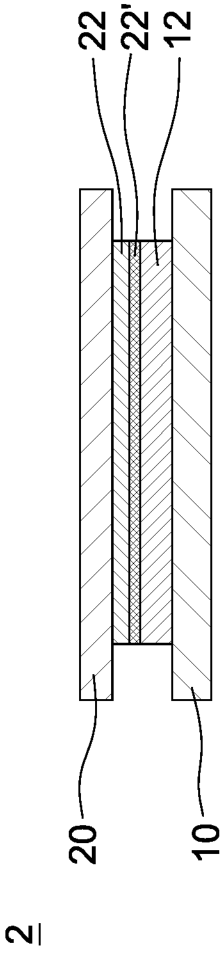
FIG. 2B illustrates a cross-sectional view of a semiconductor package structure of FIG. 2A.

FIG. 2A illustrates a top view of a semiconductor package structure 2 in accordance with some embodiments of the present disclosure. FIG. 2B illustrates a cross-sectional view the semiconductor package 2 taken along the line A-A' of FIG. 2A. The blocking pad 22 is disposed along the edge R1*e*1 of the first region R1. The third region R3 has a length L3. The length L2 of the blocking pad 22 is substantially the same as the length L3 of the third region R3. The blocking pad 22 can block the filling material or prevent an overflow of a filling material from entering the third region R3.

Figure 2C:
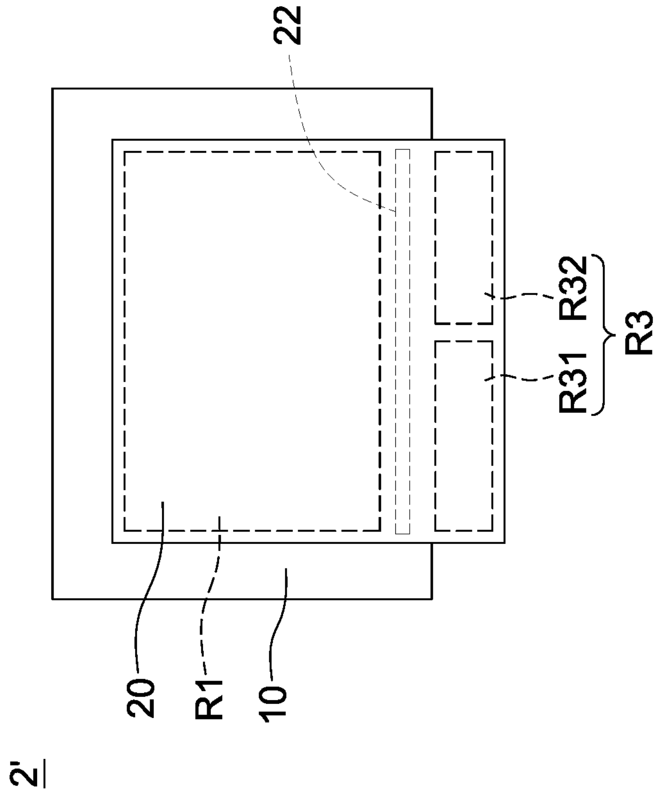
Figure 3:
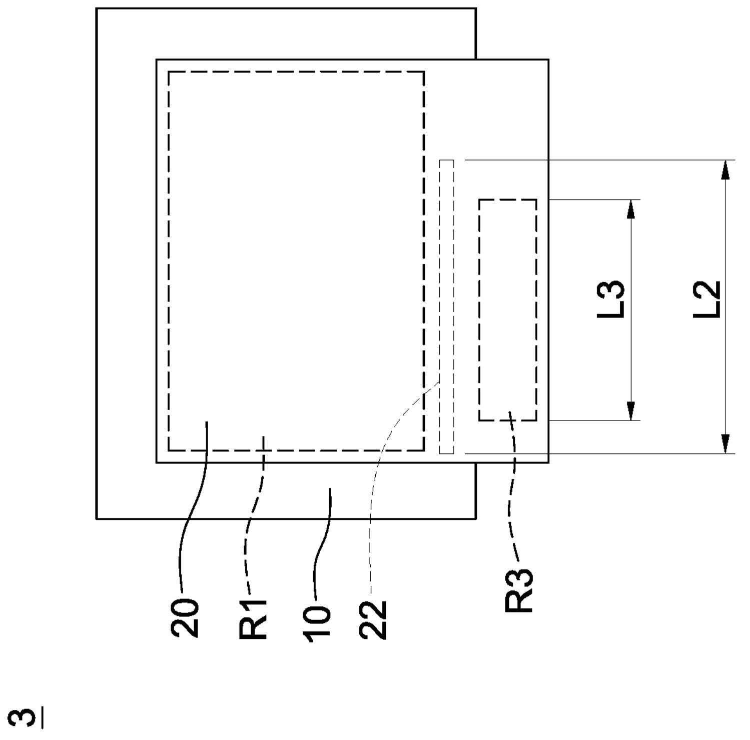

FIG. 2C illustrates a top view of the semiconductor package 2' in accordance with some embodiments of the present disclosure. The semiconductor package 2' is similar to the semiconductor package 2 except that the third region R3 includes a sub-region R31 and a sub region R32 for accommodating more optical devices. Specifically, the sub-region R31 and the sub-region R32 are configured to independently accommodate an optical device. As shown in FIG. 2C, the length of the blocking pad 22 (not denoted) is substantially the same as or greater than a total of a length of the sub-region R31 and a length of the sub-region R32. The blocking pad 22 can block the filling material or prevent an overflow of a filling material from entering the sub-region R31 and the sub-region R32.

FIG. 3C illustrates a top view of the semiconductor package 3 in accordance with some embodiments of the present disclosure. The semiconductor package 3 is similar to the semiconductor package 2 except that the length L2 of the blocking pad 22 is greater than the length L3 of the third region R3. The blocking pad 22 can block the filling material or prevent an overflow of a filling material from entering the third region R3.

Figure 4:
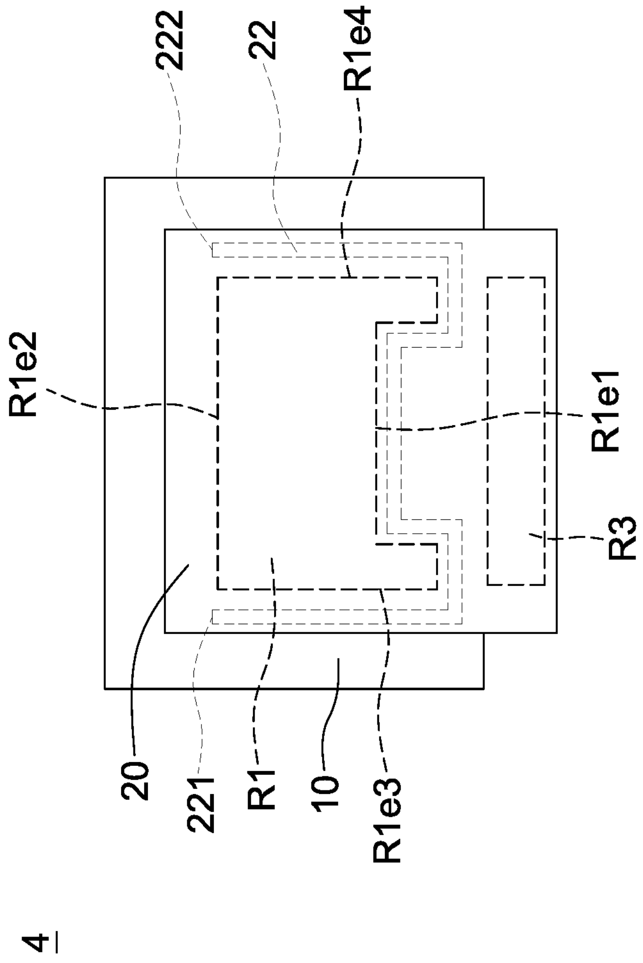

FIG. 4 illustrates a top view of the semiconductor package 4 in accordance with some embodiments of the present disclosure. The semiconductor package 4 is similar to the semiconductor package 2 except that the blocking pad 22 is disposed along the edge R1*e*1 of the first region R1 and the blocking pad 22 is not in a shape of straight strip. As illustrated in FIG. 0.4, the first region R1 has edges R1*e*1, R1*e*2, R1*e*3 and R1*e*4, the edge R1*e*2 is opposite to the edge R1*e*1 while the edges R1*e*3 and R1*e*4 are adjacent to the edges R1*e*1. The blocking pad 22 may be bent or serpentine or may have any other suitable shape, and the blocking pad 22 may further extend along at least one of the edges R1*e*3 and R1*e*4 of the first region R1. For example, an end 221 of the blocking pad 22 may extend along the edge R1*e*3 and toward the edge R1*e*2, and an end 222 of the blocking pad 22 may extend along the edge R1*e*4 and toward the edge R1*e*2. The blocking pad 22 may surround the first region R1 or the bonding pads 21 (not shown in FIG. 4) of the first region R1 and have an opening at the edge R1*e*2 to expose the first region R1.

Figure 5:
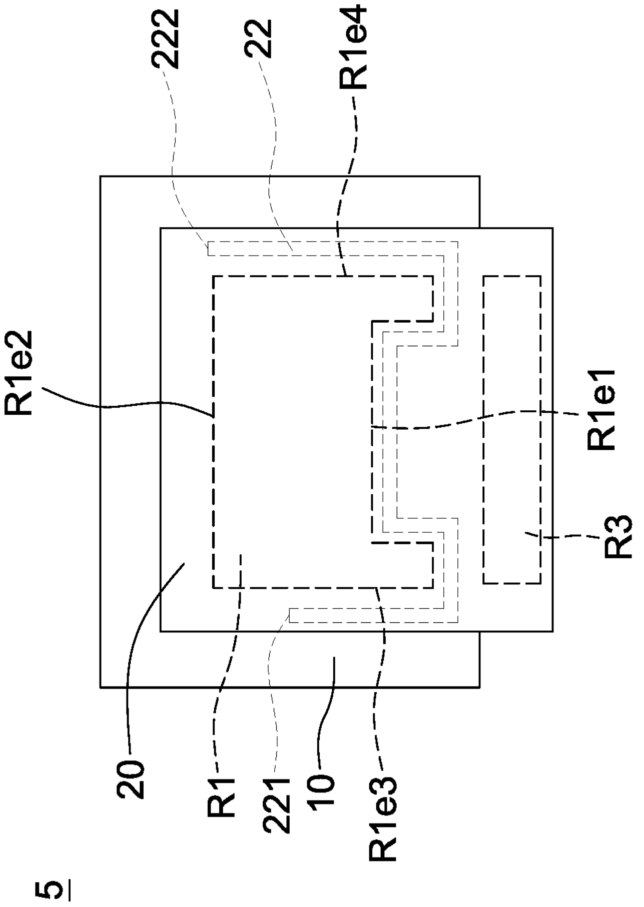

FIG. 5 illustrates a top view of the semiconductor package 5 in accordance with some embodiments of the present disclosure. The semiconductor package 5 is similar to the semiconductor package 4 except that the blocking pad 22 extends along the edges R1*e*3 and R1*e*4 of the first region R4 and the portions extending along the edges R1*e*3 and R1*e*4 may have different length. For example, as illustrated in FIG. 5, the portion extending along the edge R1*e*3 may be shorter than the portion extending along the edge R1*e*4.

FIG. 6A, FIG. 6B, FIG. 6C and FIG. 6D illustrate various operations in a method of manufacturing a semiconductor package structure 1 in accordance with some embodiments of the present disclosure.

Figure 6A:
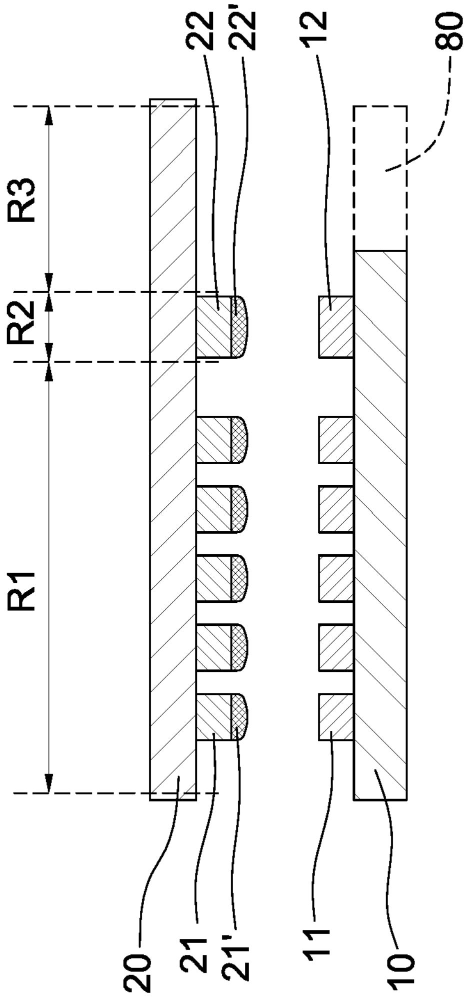
FIG. 6A, FIG. 6B, FIG. 6C and FIG. 6D illustrate various operations in a method of manufacturing a semiconductor package structure in accordance with some embodiments of the present disclosure.

Referring to FIG. 6A, a second component 20 is provided. The second component 20 includes a first region R1, a second region R2 and a third region R3. The first region R1 of the second component 20 includes a plurality of bonding pads 21 and the second region R2 of the second component 20 includes a blocking pad 22. The bottom surface of the bonding pads 21 and blocking pad 22 includes solder material 21' and 22', respectively. A first component 10 is also provided. The first component 10 includes bonding pads 11 and blocking pads 12 which correspond to the bonding pads 21 and blocking pad 22 of the second component 20, respectively. The second component 20 is disposed over a first component 10. The first component 10 may include alignment marks 70 (see FIG. 6D) on its upper surface. In some embodiments, a dummy component 80 may be adopted. The dummy component 80 may include alignment marks 70 (see FIG. 6D) to assist the alignment of the second component 20 with the first component 10. In some embodiment, the upper surface of the dummy component 80 and the upper surface of the first component 10 may be at the same elevation. In some embodiment, the upper surface of the dummy component 80 and the upper surface of the first component 10 may be at different elevations, for example, the upper surface of the dummy component 80 may be at a lower or higher elevation than the upper surface of the first component 10. The dummy component 80 may be removed during subsequent operations.

Figure 6B:
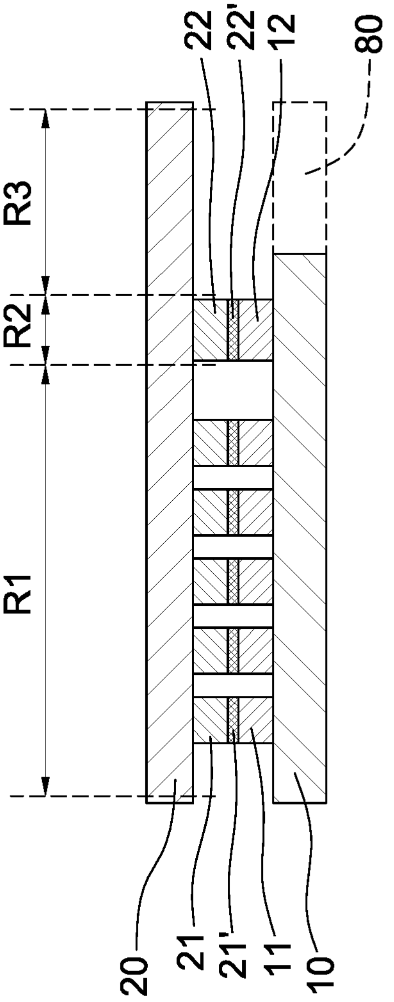

Referring to FIG. 6B, a bonding process is carried out to bond the first component 10 with the second component 20. The bonding pads 21 are bonded with the bonding pads 11 and the blocking pad 22 is bonded with the blocking pad 12.

Figure 6C:
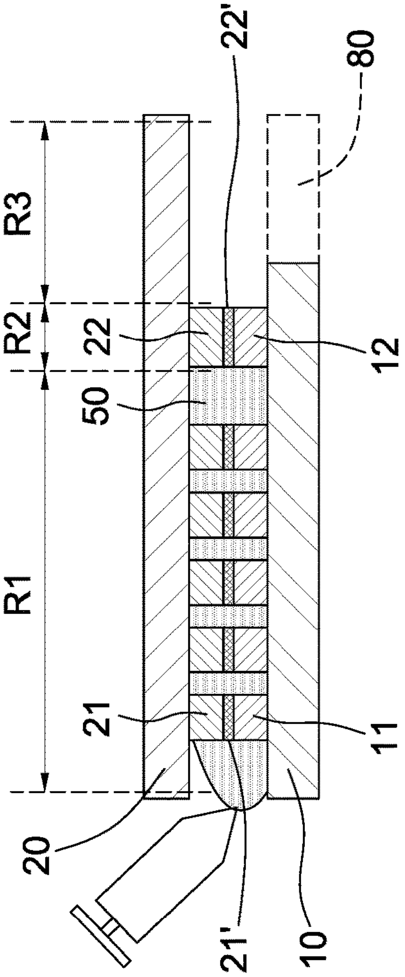
Figure 6D:
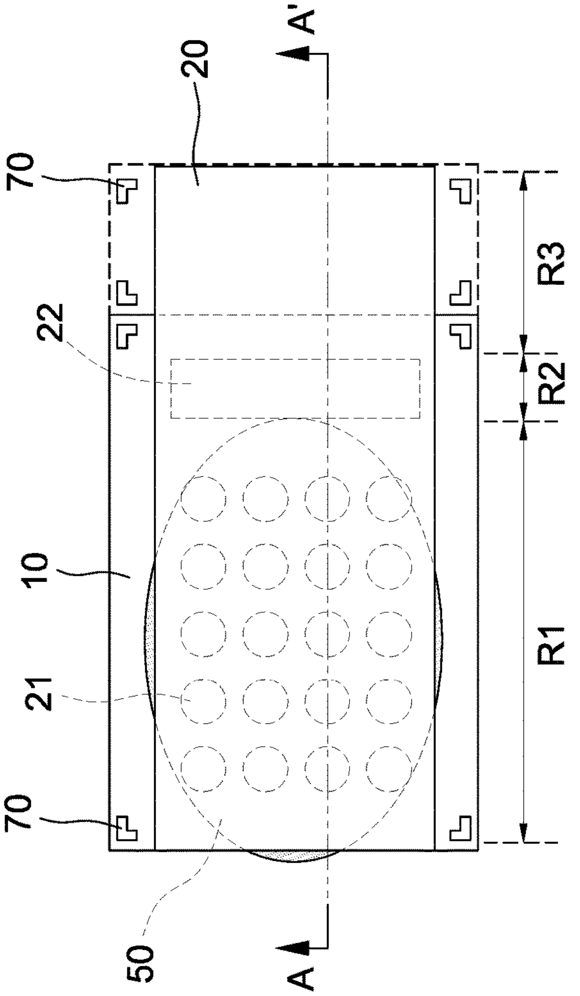

FIG. 6C illustrates a cross-sectional view of the semiconductor package structure taken along the line A-A' of FIG. 6D. FIG. 6D illustrates a top view of the semiconductor package structure. Referring to FIG. 6C and FIG. 6D, an operation of disposing a filling material 50 between the first component 10 and the second component 20 to surround the bonding pads 11 and the bonding pads 21 is carried out. In such operation, the blocking pad 12 and the blocking pad 22 function as a barrier wall to block the filling material or prevent the filling material 50 from entering the third region R3. Therefore, visual inspection (e.g., naked eyes) can be adopted to determine whether a sufficient amount of filling material 50 has been disposed (for example, when an overflow of the filling material 50 is observed around the edges of the first region R1 of the second component, the disposal of the filling material 50 is completed or near completed), without causing an overflow of the filling material 50 to the third region R3.

Figure 7A:
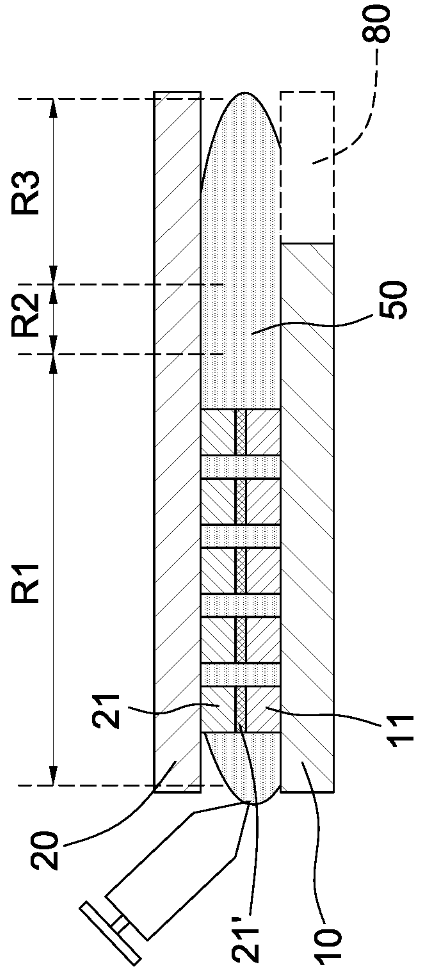
FIG. 7A and FIG. 7B illustrate an operation in a method of manufacturing a semiconductor package structure in accordance with some comparative embodiments of the present disclosure.
Figure 7B:
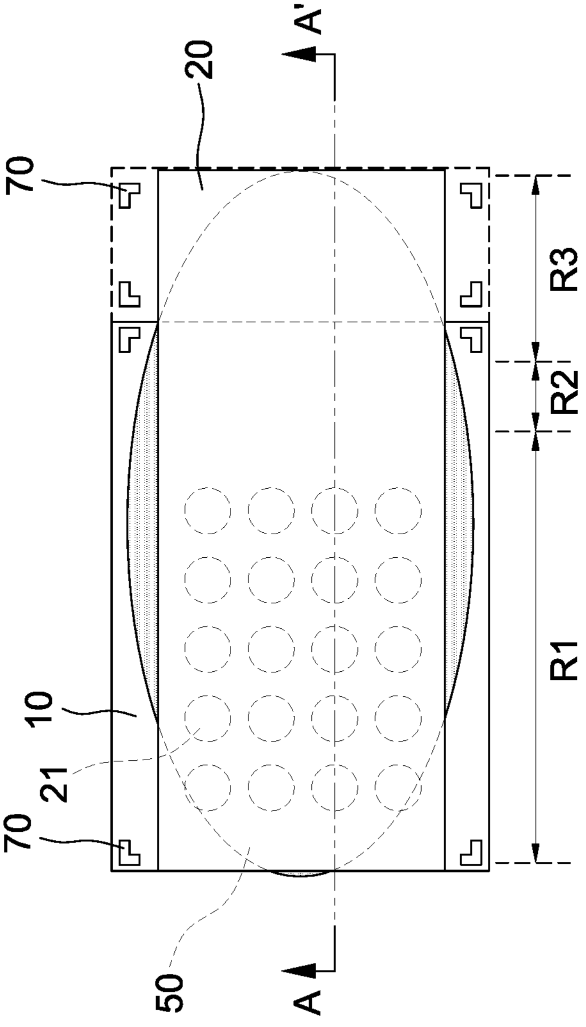

FIG. 7A and FIG. 7B illustrate an operation in a method of manufacturing a semiconductor package structure in accordance with some comparative embodiments of the present disclosure. FIG. 7A illustrates a cross-sectional view of the semiconductor package structure taken along the line A-A' of FIG. 7B. FIG. 7B illustrates a top view of the semiconductor package structure.

The semiconductor package structure illustrated in FIG. 7A and FIG. 7B is similar to the semiconductor package structure illustrated in FIG. 6C and FIG. 6D except that the semiconductor package structure illustrated in FIG. 7A and FIG. 7B does not include a blocking pad 22 or a blocking pad 12 in the second region R2. Therefore, when carrying the operation of disposing a filling material, the filling material is liable to overflow to the third region R3, which may deteriorate the light coupling efficiency between the second component and an optical device to be disposed on a surface of the third region. Undesirable contamination or damage may also occur.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to +10% of that numerical value, such as less than or equal to +5%, less than or equal to +4%, less than or equal to +3%, less than or equal to +2%, less than or equal to +1%, less than or equal to +0.5%, less than or equal to ±0.1%, or less than or equal to ±0.05%. For example, two numerical values can be deemed to be "substantially" the same or equal if a difference between the values is less than or equal to +10% of an average of the values, such as less than or equal to +5%, less than or equal to +4%, less than or equal to +3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An optoelectronic package structure, comprising:

an optical device;

a photonic component having a plurality of bonding pads and configured to be connected to the optical device;

a blocking structure disposed under the photonic component;

a filling material disposed between the plurality of bonding pads and not disposed between a bottom surface of the optical device and a lateral surface of the blocking structure in a cross-sectional view; and a circuit structure disposed under the photonic component, the circuit structure being electrically connected to the photonic component through the plurality of the bonding pads, wherein a width of one of the plurality of bonding pads is less than a width of the blocking structure; and wherein the blocking structure electrically connects the circuit structure and the photonic component.

2. The optoelectronic package structure of claim 1, wherein the filling material is not disposed between the optical device and the lateral surface of the blocking structure in the cross-sectional view.

3. The optoelectronic package structure of claim 2, wherein the filling material is not disposed between the optical device and the blocking structure in the cross-sectional view.

4. The optoelectronic package structure of claim 1, wherein the photonic component overhangs the circuit structure.

5. An optoelectronic package structure, comprising:

a photonic component having a region comprising a plurality of bonding pads;

a filling material disposed between the plurality of bonding pads; and a blocking structure disposed under the photonic component and extending along a first edge of the region in a top view perspective, wherein the blocking structure has a first lateral side surface facing the plurality of bonding pads and the filling material is in contact with the first lateral side surface of the blocking structure; and wherein the blocking structure is in a shape of a strip; and wherein the region has a second edge and a third edge opposite to the second edge, the first edge extends between the second edge and the third edge, and the blocking structure extends beyond the second edge and the third edge.

6. The optoelectronic package structure of claim 5, wherein the plurality of bonding pads are arranged in rows along the first edge of the region.

7. The optoelectronic package structure of claim 6, wherein a length of the blocking structure is greater than a length of one of the rows.

8. The optoelectronic package structure of claim 1, wherein the blocking structure comprises a first blocking pad under the photonic component and a second blocking pad on the circuit structure.

9. The optoelectronic package structure of claim 8, wherein the blocking structure further comprises a solder material between the first blocking pad and the second blocking pad.

10. The optoelectronic package structure of claim 5, further comprising an electronic die, wherein the plurality of bonding pads are disposed between the electronic die and the photonic component.

* * * * *